(12) United States Patent  
Barrenscheen

(10) Patent No.: US 9,397,684 B1  
(45) Date of Patent: Jul. 19, 2016

(54) ANALOG TO DIGITAL CONVERTER CIRCUITS AND METHODS OF OPERATION THEREOF

(71) Applicant: Infineon Technologies Austria AG, Villach (AT)

(72) Inventor: Jens Barrenscheen, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/599,055

(22) Filed: Jan. 16, 2015

(51) Int. Cl.
  *H03M 1/10* (2006.01)
  *H03M 1/12* (2006.01)
  *H03M 1/38* (2006.01)
  *H03M 1/00* (2006.01)

(52) U.S. Cl.
  CPC .............. *H03M 1/122* (2013.01); *H03M 1/002* (2013.01); *H03M 1/1023* (2013.01); *H03M 1/38* (2013.01)

(58) Field of Classification Search
  CPC ....... H03M 1/22; H03M 1/38; H03M 1/1023; H03M 1/002
  USPC .................................................. 341/120, 155
  See application file for complete search history.

(56) References Cited

U.S. PATENT DOCUMENTS

| | | | | |
|---|---|---|---|---|
| 4,063,236 A * | 12/1977 | Amemiya | ........... | H03M 1/0607 341/129 |
| 8,730,072 B2 * | 5/2014 | Petigny | ............... | H03M 1/1061 341/120 |
| 9,030,340 B1 * | 5/2015 | Waltari | ............... | H03M 1/0617 341/118 |
| 9,143,149 B1 * | 9/2015 | van Engelen | ......... | H03M 1/121 |

* cited by examiner

*Primary Examiner* — Brian Young
(74) *Attorney, Agent, or Firm* — Slater Matsil, LLP

(57) ABSTRACT

An analog to digital converter (ADC) circuit includes an input stage for supplying an input signal to an ADC for conversion to a digital signal and a control unit of the ADC. The ADC circuit further includes an operational parameter setting device configured to receive an operational parameter setting signal indicative of an operating parameter for the input stage from the control unit. The operational parameter setting device is configured to set an operating parameter for the input stage based on the operational parameter setting signal.

28 Claims, 6 Drawing Sheets

ANALOG TO DIGITAL CONVERTER CIRCUITS AND METHODS OF OPERATION THEREOF

TECHNICAL FIELD

The present invention relates generally to signal processing circuits, and, in particular embodiments, to analog to digital converter circuits and methods of operation thereof.

BACKGROUND

Digital control applications may include analog input signals supplied to an analog to digital converter (ADC) component for conversion into a digital signal. An ADC converts a continuous physical quantity (usually voltage) to a digital number that represents the quantity's amplitude. Instead of doing a single conversion, an ADC often performs conversions ("samples") of the input periodically. The result is a sequence of digital values that have been converted from a continuous-time and continuous-amplitude analog signal to a discrete-time and discrete-amplitude digital signal.

ADCs are commonly used in the electronic field, for example, during data acquisition or data reproduction. As an illustration, microcontrollers often comprise analog to digital converters (ADCs) which convert an analog voltage applied to their input pin to a digital value.

Many types of ADCs are commonly used. A successive approximation (SAR) ADC is a type of analog-to-digital converter that converts a continuous analog waveform into a discrete digital representation via a binary search through all possible quantization levels before finally converging upon a digital output for each conversion. In particular, a SAR ADC comprises an input multiplexer that allows selection of an analog input channel from a plurality of analog input channels connected to the input pins of the ADC. The conversion may be based on a controlled timing sequence or based on various events.

SUMMARY

In accordance with an embodiment of the present invention, an analog to digital converter (ADC) circuit comprising an input stage for supplying an input signal to an ADC for conversion to a digital signal and a control unit of the ADC. The ADC circuit further includes an operational parameter setting device configured to receive an operational parameter setting signal indicative of an operating parameter for the input stage from the control unit. The operational parameter setting device is configured to set an operating parameter for the input stage based on the operational parameter setting signal.

In accordance with an alternative embodiment of the present invention, a method of operating an analog to digital convertor (ADC) circuit includes receiving an operational parameter setting signal at an operational parameter setting device from a control unit of an ADC. The method further includes setting an operating parameter based on the operational parameter setting signal and configuring an input stage coupled to an input of the ADC using the operating parameter.

In accordance with an alternative embodiment of the present invention, an analog to digital converter (ADC) circuit includes a control unit coupled to an ADC, and an input stage for supplying an input signal to the ADC. An operational parameter setting device is coupled to the input stage. The control unit is configured to send a signal to the operational parameter setting device through a hardware link. The operational parameter setting device is configured to provide an operating parameter to the input stage based on the signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Analog to digital converters are used in many applications to convert the level of an analog input signal into a digital representation of the analog input signal. This is because a digital value is easier to handle in complex control loops or to store in memory and wait until the related CPU task is executed.

In many such applications, analog input stages for input signal conditioning are connected between the signal source and the ADC input signal. For example, an analog device such as a filter, amplifier, and others may be used to process the input signal before providing it to the ADC unit to convert it to the digital signal. This is because in different use cases, an input signal may have different desired characteristics, but is converted at the same ADC, which has an optimal input window for conversion. Therefore, the input signal may need to be adjusted before conversion at the ADC so as to be within the ADC's preferred operating window. In some use cases, the input signal characteristics may change during run-time and the input stage has to be adapted depending on the current use case.

The variation in input signal may need an adjustment of the input devices, which are in the input path of the ADC. For example, a first gain setting of an input amplifier may be needed while converting a first input signal at a first point in time, whereas a second gain setting may be needed while converting the first input signal at a second point in time, or while converting a second input signal, a different third gain setting may be needed for the input amplifier. In further examples, there may be a need to change other characteristics of the input signal. Such examples include offset value, input impedance, or filter parameters. In another example, in one operational mode, the input device may track the input signal in a range between 0V-2.4 V and forward it to the ADC in a range between 0V-2.4 V while in another operating mode, an input analog device may track the input signal between 2.0-2.8V and scale it to 0V-2.4V for the ADC.

Similarly, in another example, the biasing of an input amplifier may be adapted depending on the input signal. If the output signal of an input amplifier is not needed for a certain time period or if the output signal changes slowly, then the input amplifier may be set to a first operating mode having low power consumption for that time period. The input amplifier may then switch over to a second operating mode with a higher power consumption when the output signal is needed or the input signal changes at a faster rate.

Figure 1:
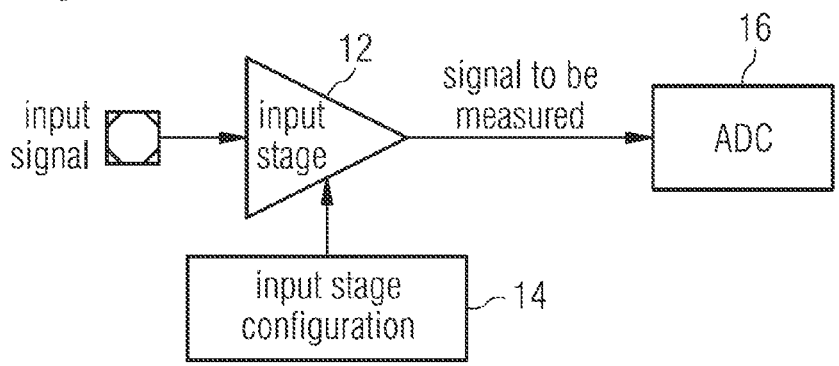
FIG. 1 illustrates a schematic block diagram of the configuration of an Analog to Digital Converter (ADC) having an input stage for modifying an input signal before it is converted at the ADC.

FIG. 1 illustrates a schematic block diagram of the configuration of an Analog to Digital Converter (ADC) having an input stage for modifying an input signal before it is converted at the ADC.

Referring to FIG. 1, an input signal is received at an input of the input stage 12. The input stage 12 outputs the modified input signal to the ADC 16. The modification of the input signal is based on the operation parameter stored in the input stage configuration 14, which may be a memory register.

For example, the signal to be measured may have to have a specific voltage range for the ADC 16. If the signal to be measured is not in that range, the input stage 12 introduces a gain to amplify the signal to be measured. For example, if the input is between 0 V to 1 V and the ADC 16 is configured to convert between 0 V to 2 V, the gain of the input stage 12 is adjusted so that the output from the input stage 12 is between 0 V to 2 V.

In another example, if the input signal is slowly changing, then a low bias current may be provided to the input stage 12. On the other hand if the input signal is changing fast, more bias current may be provided so that the input stage 12 is working faster. If there is no input signal to be measured by the ADC, no bias current is needed at the input stage 12, and the input stage 12 may be powered down.

Similarly, some part of the input signal may not need to be measured. For example, noise may not need to be converted to a digital value, and may be removed from the input signal prior to providing to the ADC. The filter characteristics of the input stage may be adapted to the characteristics of the noise present on the input signal.

As discussed above, in different examples, the input stage 12 may be used to maintain the voltage range within a certain limit, amplify the input signal, offset the input signal, and/or filter the input signal. Therefore, for optimal performance, the behavior of the input stage may have to be adapted depending on the input signal itself.

Similarly, as another illustration, even if the signal amplitude is not modified, an input buffer may be needed when the input signal is delivered by a high ohmic source that is not suitable to drive the input of the ADC directly. In this case, the input stage works as impedance converter.

The control or configuration data for the operation parameters of the input stage is either fixed by design or can be configured by programming configuration data registers using a CPU or microcontroller. In case of fixed design, the operation parameters are also fixed providing no further flexibility. In such cases, there is only one set operating parameters which may be written into the configuration register at start-up, or during initial set-up.

Figure 2:
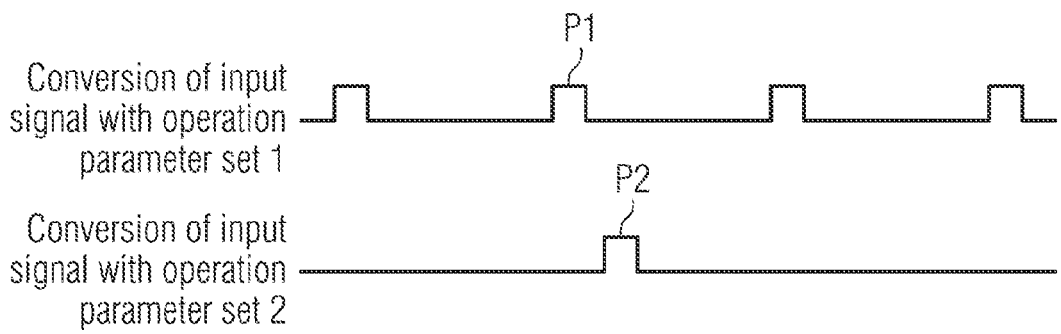
FIG. 2 illustrates a sequence of conversions of the input signal with different operation parameters of the input stage.

FIG. 2 illustrates a sequence of conversions of the input signal with different operation parameters of the input stage.

Referring to FIG. 2, a typical sequence of ADC measurements of the same input signal is illustrated with different operation parameters of the input stage 12. In this illustration, the input signal is periodically converted with operating parameter set 1, which in one example may be a voltage operating range of 2.0 V to 2.8 V. However, from time to time, a conversion of the same input signal with an operating parameter set 2 is introduced, which has a different voltage range, e.g., 0 V to 2.4 V, thus showing the complete window of the input signal at a lower precision. Such functionality may be needed in applications where the input signal source and the input signal path have to be checked periodically. For example, a first control task taking into account the conversions within the operating range of 2.0-2.8V does not need the information about the exact voltage if it is below 2.0V, whereas a second control task needs this information. Thus, a part of the operation parameters may define, for example, the amplification and offset of the input stage for measuring the regular input signal. In this example, the ADC results of the upper trace in FIG. 2 are made available to the first control task and the ADC results of the lower trace in FIG. 2 are made available to the second control task. A control task is a function that can be implemented in software or in hardware or in a combination of both that takes the ADC result as an input to change the behavior or the characteristics of the device. However, the operation of the input stage 12 using the operation parameter set 1 should not be distorted by the different operating conditions of the operation parameter set 2. Further, the settling time of the input stage 12 has to be accounted for because once an operational parameter set is applied, the input stage 12 may take some settling time before being available for normal operation. Otherwise, the input stage 12 has not settled and would output a corrupted signal to the ADC 16. In other words, the switch in operation of the input stage 12 has to be performed with a defined timing relation to the ADC conversions.

In some designs, software may be used to write into the memory register storing the configuration (e.g., input stage configuration 14). However, such pure software control is not well suited for changing input conditions or other scheduling mechanisms that have no direct influence on the points in time when the related software part is executed. For example, when a AD conversion request requiring a different operating condition is received, the input stage has to be switched in real time. However, the software is not aware of this information. Even if software receives this information, there may be significant delay in its implementation unless all other tasks are interrupted, for example, by using a high priority interrupt.

Therefore, the setup in FIG. 1, is unable to change the operation parameter of the input stage 12 in real time without special interactions with software, such as interrupt handling.

Embodiments of the present invention may overcome these issues and other difficulties with conventional designs by using a hardware based implementation of the ADC circuit relating to configuration of the input stage.

Figure 3:
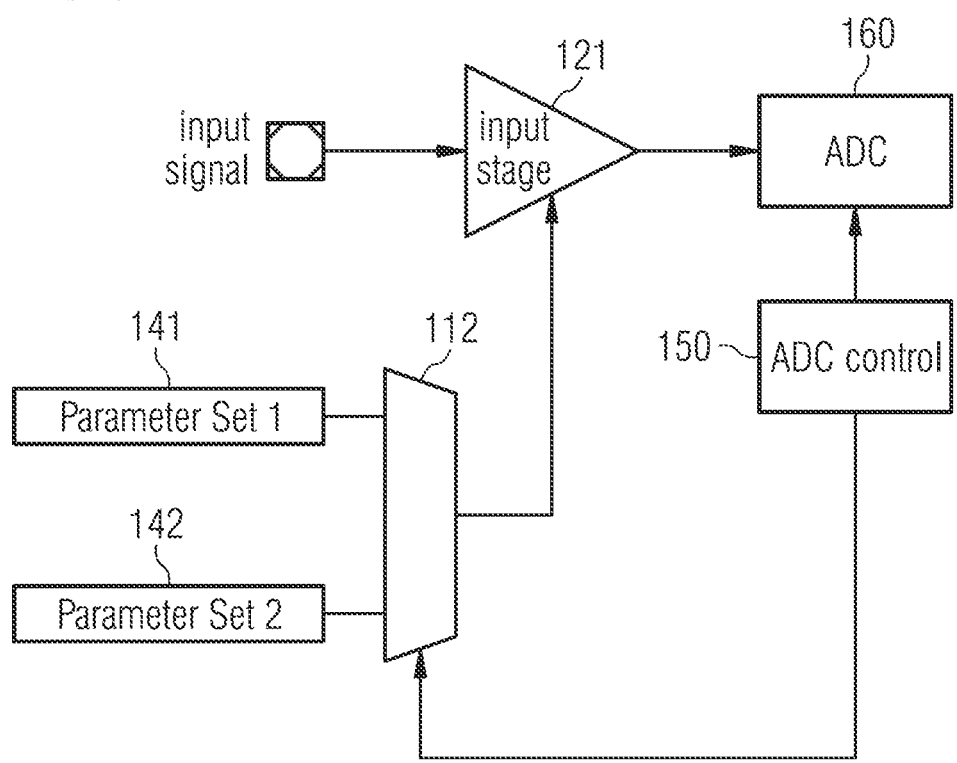
FIG. 3 illustrates a schematic block diagram of a hardware based ADC circuit having an input stage configured by the ADC controller in accordance with an exemplary embodiment of the present invention.

FIG. 3 illustrates a schematic block diagram of a hardware based ADC circuit having an input stage configured by the ADC controller in accordance with an exemplary embodiment of the present invention.

Exemplary embodiments of the present invention use information from the controller of the ADC, which is aware of the sequence of conversions that are requested, to deliver information about the input voltage to different control tasks inside the device.

Referring to FIG. 3, an input signal is received at the input of an input stage 121. The output from the input stage 121 is sent towards the input of the ADC 160. The ADC 160 is coupled to an ADC Control 150, which may schedule ADC conversions and may be a digital control unit. The ADC Control 150 may receive external triggers and schedule ADC conversions at the ADC 160. Thus, the ADC Control 150 knows when the next scheduled ADC conversion will take place, and this scheduling information can be used to anticipate the next ADC conversion or sequence of ADC conversions. Accordingly, in order to allow sufficient time for the input stage 12 to settle after its operation parameters have changed, the timing for changing an operation parameter setting of the input stage 121 may be defined by the ADC Control 150, e.g., according to the next scheduled ADC conversion. The input stage 121 may include any suitable analog device such as buffer, amplifier, filter, and others, to adjust the operation parameter setting of the input stage 121.

During operation, as an example, once the ADC 160 is initialized, a conversion queue may be set up and each channel to be scanned may be added to the ADC's queue. For example, the ADC 160 may start the conversion when it is triggered by the ADC Control 150. Because the ADC Control 150 also schedules ADC conversions at the ADC 160, the ADC Control 150 is aware of exactly when a setting of the input stage 121 may be changed without disturbing an ongoing or future ADC conversion and the settling times of the input stage can be taken into account automatically. In this way, the operation parameters of the input stage can be dynamically changed without providing a corrupted signal to the ADC.

Referring to FIG. 3, the ADC Control 150 may transmit this scheduling information to an input parameter setting device 112, which may be a multiplexer as one example. In one embodiment, the setting device 112 may operate by selecting between two or more parameter sets. The scheduling information may be flag, a control signal, or other signal that represents the input signal being processed at the ADC 160. Based on the scheduling information received from the ADC Control 150, the input parameter setting device 112 may select between the first parameter set 141 or a different second parameter set 142. The input parameter setting device 112 may select between a plurality of operating parameter sets, including more than two operating parameter sets, in case the input parameter setting device 112 comprises additional input lines.

In various exemplary embodiments, the ADC Control 150 may transmit a digital signal through a hardware link connecting the input parameter setting device 112 with the ADC Control 150. The hardware link may be, for example, a digital bus, a control bus, system bus, or alternatively the connection may be performed using an analog bus.

The input parameter setting device 112 sets the operation parameters of the input stage 121 by providing the selected first parameter set 141 or the second parameter set 142 to the input stage 121. Each parameter set may have a number of operating parameters, for example. Alternatively, in some implementations, each parameter set may include only a single operating parameter. Thus, the timing of the change in configuration of the input stage 121 is synchronized with the sampling and processing of that input signal at the ADC 160 according to the scheduling information.

In various exemplary embodiments, the ADC Control 150 is a central unit that provides information to both the ADC 150 and the hardware based input parameter setting device 112. Because the ADC Control 150 is a central unit having access to both units through a hardware link, any signal propagation delays in the signal chain may also be properly accounted for. This enables the pre-processing of the input signal at the input stage 121 using the appropriate operation parameters to be synchronized with the processing at the ADC 160.

In various exemplary embodiments, all the operations of the input parameter setting device 112, and the configuration of the input stage 121 as well as the link between the ADC Control 150 and the input parameter setting device 112 may be performed using hardware without using any real-time software.

Accordingly, in various exemplary embodiments of the present invention, no timing critical software or real-time software may be needed. Thus, the use of high level interrupts or other ways to prioritize the configuration process of the input stage 121 is avoided.

Figure 4:
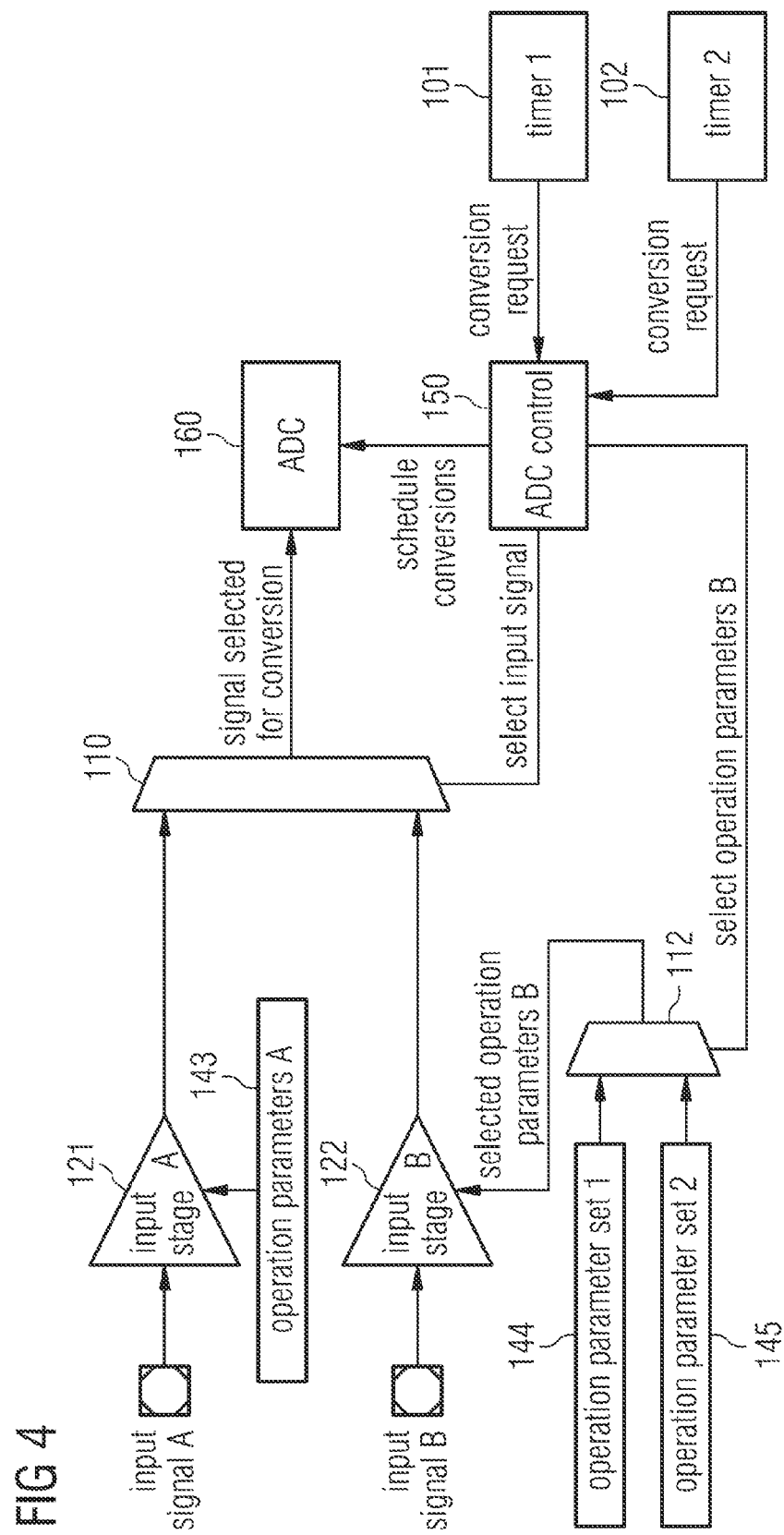
FIG. 4 illustrates a schematic block diagram of a hardware based ADC circuit with a ADC controller used for selecting operation parameters of an input stage in accordance with an exemplary embodiment of the present invention.

FIG. 4 illustrates a schematic block diagram of a hardware based ADC circuit with a ADC controller used for selecting operation parameters of an input stage in accordance with an exemplary embodiment of the present invention.

FIG. 4 illustrates an ADC with an input signal selector 110 for selecting one input signal to be converted from several possible input signals. The ADC may be a successive approximation register (SAR) type converter in one example. Thus, a single ADC 160 may be used to convert from multiple sources of input signals.

Referring to FIG. 4, a first input stage (A) 121 and a second input stage (B) 122 provide inputs to the input signal selector 110, which may be a multiplexer. The input signal selector 110 receives an input signal from the ADC Control 150 and selects one of the input signals from either the first input stage (A) 121 or the second input stage (B) 122 and outputs the selected input to the ADC 160. The ADC 160 also receives a request for conversion from the ADC Control 150 so that the ADC 160 converts the input signal selected by the input signal selector 110.

In one illustration, the operation parameter 143 used to configure the first input stage 121 is fixed. However, this is only for illustration. The second input stage 122 has a variable operating configuration that is selected by the input parameter setting device 112. In some exemplary embodiments, the input parameter setting device 112 may also be used to select between multiple operation parameters for multiple input stages, or each input stage may be coupled to a separate input parameter selection or setting device.

In various embodiments, each input stage may have its own set of possible operation parameters. However, in some embodiments, some input stages may share a common plurality of operation parameter sets from which a particular operation parameter set is selected. FIG. 4 is only one illustrative embodiment and the configuration of the input stages and operation parameter sets may be configured and modified by a person having ordinary skill in the art to suit the particular need.

As illustrated in FIG. 4, the ADC Control 150 may receive a conversion request from a first timer 101 and a second timer 102. The first timer 101 and the second timer 102 are just for illustration and in other exemplary embodiments may be any other type of unit that can request a conversion. In other exemplary embodiments, one or more software tasks may also request for conversion from the ADC Control 150. The conversion requests are received at the ADC Control 150 and then forwarded to the ADC in a defined sequence.

In one exemplary embodiment, the first timer 101 may periodically request conversions of input signal B with the first operation parameter set 144, whereas the second timer 102 may from time to time request conversions using the second parameter 145. For example, the first timer 101 may generate requests representing the pulses P1 of FIG. 2 while the second timer 102 may generate requests representing the pulses P2 of FIG. 2.

The ADC Control 150 may provide a signal indicative of the operation parameter that is to be selected by the input setting device 112 to the input setting device 112. The operation parameter set (e.g., parameter sets 143, 144, and 145) may be indicative of a fixed value, for example, defined in design, or may be programmable (and reprogrammable) by a CPU, which may be located somewhere in the system with programming path to the related configuration register. For example, a first operation parameter set 144 leads to an operation range of 2.0 V to 2.8 V whereas the second operation parameter set 145 may lead to an operation range of 0 V to 2.4 V.

In another exemplary embodiment, the operation parameter sets may indicate the powering up (or powering down) of the associated input stage. As an illustration, the first operation parameter 144 may represent a power saving mode of the input stage 122 while the second operation parameter 145 may represent a power up mode. Because the ADC Control 150 is aware of the scheduling conversion, the ADC Control 150 is also aware when the input stages will not be processing any input signal. For example, after the initial sampling of the input signal, the ADC 160 may take time to convert the sampled signal. During a sampling, the selected input channel may be driven onto a sample capacitor and a digital to analog converter (DAC) capacitor array may be initialized. During conversion, which may be significantly longer than the sampling phase, the voltage in the DAC capacitor array is converted to a digital value, for example, using a successive approximation resolution sequence. In various exemplary embodiments, the ADC Control 150 can instruct one or more of the input stages to power down during this wait time to save power. In the example shown in FIG. 4, the ADC 160 can only convert one input signal after the other. In one exemplary embodiment, an input stage of an input signal that is not requested for conversion can be set to a power saving mode until the input signal is needed.

The ADC Control 150 may be included into a single component comprising the ADC 160 in some exemplary embodiments or may be a separate unit in other embodiments. However, the ADC Control 150 is configured to provide both the ADC 160 (part of the ADC that is processing the input signal) with the scheduled conversion requests, the input signal selector 110 with a selection signal, and the input parameter setting device 112 with a parameter selection signal.

Exemplary embodiments of the present invention thus enable the ADC Control 150 to autonomously define or select the operation parameters for an input stage. The available configurations for the operation parameter sets may be fixed by design or may be programmable by software so that the functioning of the input stages may be adjusted during in-field operation. For example, during initial boot-up, the initialization of the software kernel may also write into one or more of the configuration registers for the operation parameter sets.

However, in various exemplary embodiments of the present invention, the selection between the operation parameters during operation does not require any timing critical software and is performed completely using hardware. In various exemplary embodiments, the hardware link may be an analog connection, digital connections, where examples include routing wires such as die-to-die routing, within chip routing, inter package routing, busses such as inter module bus, and others.

Thus, using various exemplary embodiments of the present invention, no real-time software intervention may be needed to change the setting of the second input stage 122, and as such there may be no risk of corrupted conversion results due to any mismatch between software activity and hardware activity.

Figure 5:
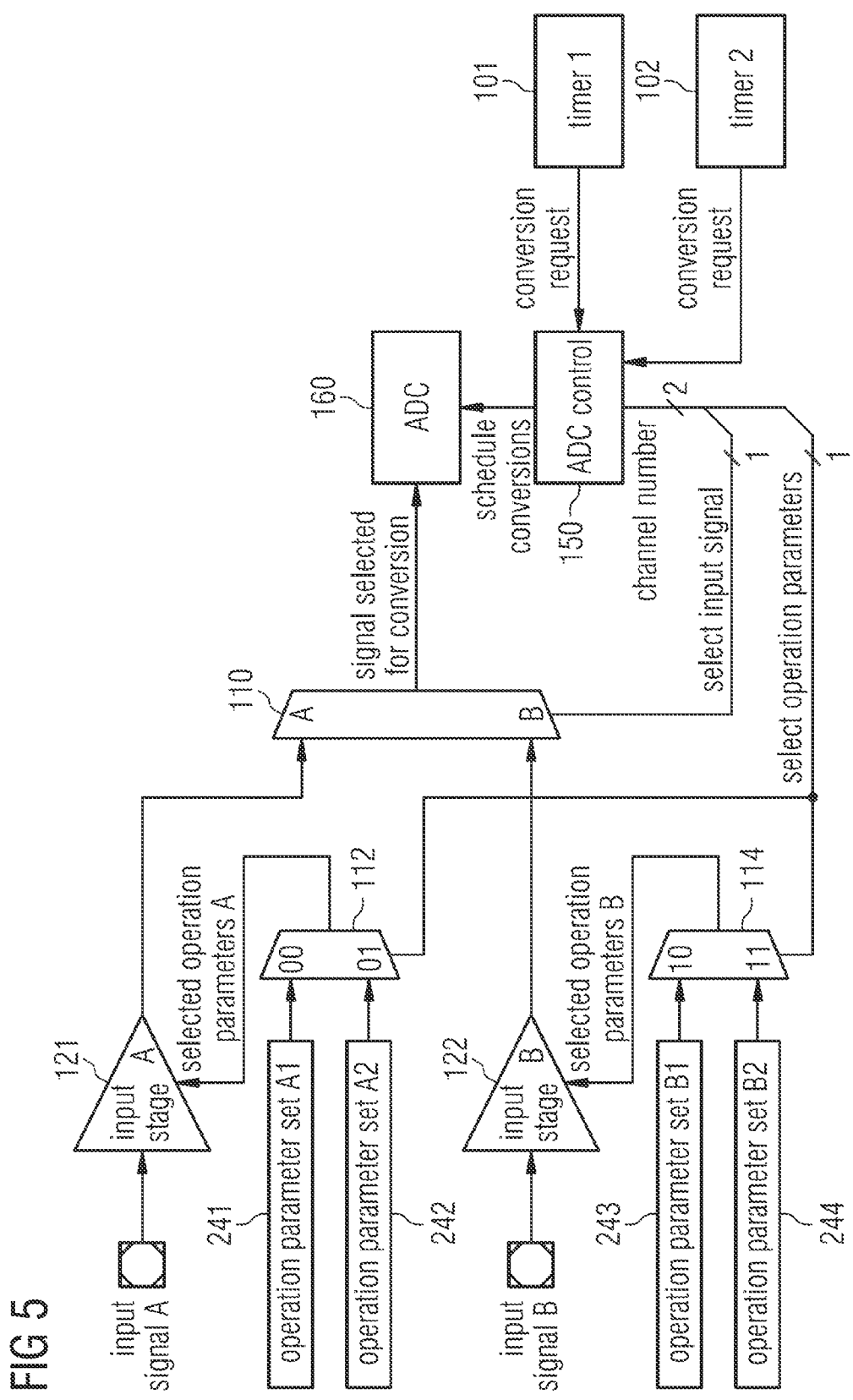
FIG. 5 illustrates a schematic block diagram of a hardware based ADC circuit using channel number for selecting operation parameters of an input stage in accordance with an exemplary embodiment of the present invention.

FIG. 5 illustrates a schematic block diagram of a hardware based ADC circuit using channel number for selecting operation parameters of an input stage in accordance with an exemplary embodiment of the present invention.

In the illustrative embodiment of FIG. 5, the ADC Control 150 selects the input signal and the operation parameter set for the first and the second input stages 121 and 122 using the channel number of the ADC. In conventional controllers, the channel number from the ADC may be used to indicate which input stage's output is selected for conversion. In various exemplary embodiments of the present invention, the channel number additionally indicates which operation parameter set is to be selected for each input stage.

As an illustration, the ADC may have 32 channel numbers of which only 24 may be used as inputs for analog signals. The remaining eight unused channel numbers may be programmed to indicate the selection of the operation parameter set for at least one of the analog input signals.

In this illustrated embodiment, both the first input stage 121 and the second input stage 122 may be configured to be initialized with different operation parameter sets from a first operation parameter setting device 112 and the second operation parameter setting device 114. The first operation parameter setting device 112 selects between the first operation parameter set A1 (241) and the second operation parameter set A2 (242) for a first analog input signal. The second operation parameter setting device 114 selects between the third operation parameter set B1 (243) and the fourth operation parameter set B2 (244) for a second analog input signal. The selection of which analog input signal is going to be converted is performed by input multiplexer 110.

An illustrative example embodiment is presented below in Table I, which indicates the definition of channel numbers CH0-CH3 for illustration. In other embodiments, the definition of the channel numbers may be appropriately changed. For example, additional channels may be defined if more than four operation parameter sets have to be selected. Alternatively, the definitions may also be changed depending on the configuration of the input stages.

TABLE I

CH0 (channel number = 00): select input signal A with operation parameter set A1 (141)
CH1 (channel number = 01): select input signal A with operation parameter set A2 (142)
CH2 (channel number = 10): select input signal B with operation parameter set B1 (143)
CH3 (channel number = 11): select input signal B with operation parameter set B2 (144)

Referring to FIG. 5, when the selected channel number is "10," the second input parameter setting device 114 selects the third operation parameter set B1 (143).

Figure 6A:
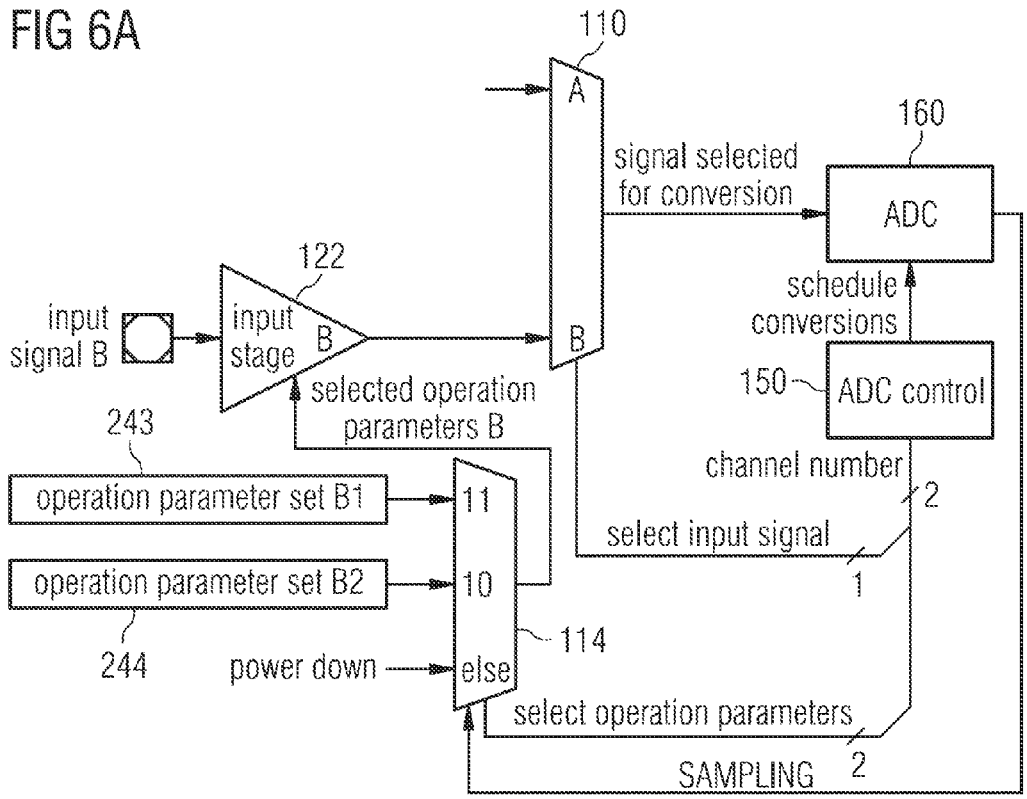
FIG. 6A illustrates a portion of an ADC circuit showing only the second input stage to better highlight the power saving features in accordance with exemplary embodiments of the present invention.

FIG. 6A illustrates a portion of an ADC circuit showing only the second input stage to better highlight the power saving features in accordance with embodiments of the present invention. The activation of the input stage during the sampling phase of the ADC 160 is illustrated in FIG. 6A.

In further embodiments, in devices with ADC having a capacitive array, the capacitive array may be connected to the input signal to be measured during a sampling phase and then disconnected from the input while the conversion takes place within the ADC 150. This is because the operation of the respective input stage is only needed only until the sampling phase is completed. After the signal has been sampled, the ADC 160 performs the conversion from analog to digital value, which may take significantly more time than the sampling time. Thus, the inputs stages may be deactivated immediately after the sampling phase because the input signal has already passed into the ADC 160 for further processing.

If the input stage is activated according to the selected operation set at the beginning of the sampling phase, the duration of the sampling phase has to include the settling time of the input stage. The above processes may increase the delay time or effective sampling time compared to an embodiment where the input stage is permanently activated. However, in many power hungry applications, the additional sampling time may be acceptable because of the reduced average power consumption.

For further illustration, an additional information to control the input stages is illustrated using Table II below. The configuration in Table II may be used to lower the power consumption of the circuit. In various embodiments, the input stages that are not selected may power down during the sampling and conversion of the input signal at the other input stage or while the ADC is idle (no request for conversion scheduled). For example, when the second input signal B at the second input stage 122 is selected, then the first input stage 121 may be safely powered down or moved to a lower power consumption mode.

TABLE II

| |
|---|
| CH0: power down input stage B and select input signal A with operation parameter set A1 (141) |
| CH1: power down input stage B and select input signal A with operation parameter set A2 (142) |
| CH2: select input signal B with operation parameter set B1 (143) and power down input stage A |
| CH3: select input signal B with operation parameter set B2 (144) and power down input stage A |

Accordingly, using such a configuration, the power consumption may be significantly lowered because the input stages that are not working are not consuming power. Thus, in various exemplary embodiments of the present invention, unused or free channel numbers may be defined to implement various operation parameter selection signals.

Additional information relating to the state of the ADC 160 has to be passed onto the first and the second input parameter setting devices 112 and 114. After the initial activation of the first and the second input stages 121 and 122, a SAMPLING signal may be used to deactivate the input stages. In other words, the SAMPLING signal may indicate the time when the ADC is sampling data (or not sampling data). Thus, the code "else" in the second input parameter setting device 114 becomes effective either while another channel is selected or after the sampling phase of B is finished (signal SAMPLING is deactivated). It is understood that, although not shown, the first input parameter setting device 112 may also receive the SAMPLING signal from the ADC Control 160.

Figure 6B:
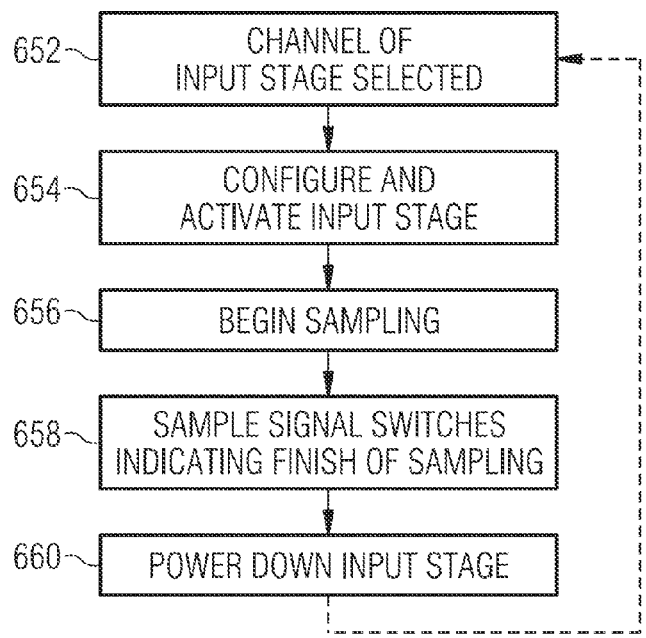
FIG. 6B illustrates a method of operating an analog to digital convertor (ADC) circuit illustrated in FIG. 6A in accordance with an exemplary embodiment of the present invention.

FIG. 6B illustrates an operation of the above circuit of FIG. 6A in accordance with an embodiment.

Referring to FIG. 6B, the ADC control unit provides the input stage and the corresponding operating parameter to be selected to the input parameter setting device by selecting a channel number (box 652) and optionally, also the SAMPLING signal that indicates the point in time when the ADC samples the output signal of the input stage. The input parameter setting device receives this information and selects the appropriate operating parameter set and the input stage is configured with the said operating parameter set (box 654). The input signal after being modified by the selected input stage is sampled at the ADC 160 (box 656). After the sampling of the input signal, the ADC 160 switches from sampling to conversion. At this time, the ADC Control 150 indicates this transition to the input parameter setting device using a SAMPLING signal (box 658). The previously selected input stage may be powered down upon receipt of this SAMPLING signal (box 660).

Figure 7:
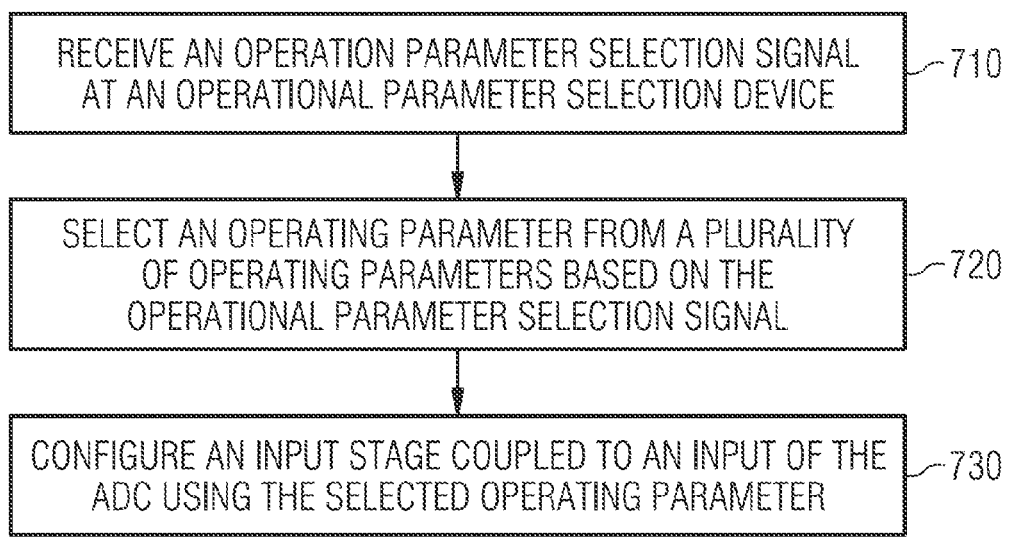
FIG. 7 describes a method of operating an analog to digital convertor (ADC) circuit in accordance with an exemplary embodiment of the present invention.

FIG. 7 describes a method of operating an analog to digital convertor (ADC) circuit in accordance with an exemplary embodiment of the present invention.

Referring to FIG. 7, at an operational parameter setting device an operational parameter selection signal is received from a control unit of an ADC (box 710). The operational parameter setting device may be a hardware device without needed software during its operation and may be a multiplexer as an example. In one embodiment, the operational parameter setting device is received at the operational parameter selection through a digital connection. In another embodiment, the operational parameter setting device is received at the operational parameter selection through an analog connection. The hardware link and the operational parameter setting device may be configured to function without implementing any timing critical software. In some exemplary embodiments, the value stored as operation parameter set can be configured by software. In other embodiments, the value is fixed by design. In some exemplary embodiments, parts of the operation parameter set can be configured by software and other parts are fixed by design.

The ADC may also receive a schedule or timing information regarding conversions to be performed at the ADC from the control unit.

The operational parameter setting device selects an operating parameter from a plurality of operating parameters based on the operational parameter selection signal (box 720). In one embodiment, a channel number of the ADC is used to select the operating parameter from the plurality of operating parameters.

An input stage coupled to an input of the ADC is configured in accordance with the selected operating parameter (box 730). The operating parameter may comprise one or more of offset value, impedance, gain, band width, efficiency, filter time, output dynamic range, slew rate, stability, settling time. The input stage may be powered down or powered up based on the selected operating parameter. Using this configuration, the input stage may modify an analog input signal and output an analog signal that is then converted to a digital signal at the ADC.

The operational parameter setting device may additionally receive, from the control unit, a sampling signal indicative of a conversion process at the ADC. For example, the sampling signal may indicate whether the ADC is currently sampling an input signal in one embodiment.

In various exemplary embodiments, the various components described in each embodiment may be part of a single chip, package, or module. Embodiments of the present invention may be applied to any type of ADC including SAR ADC, Sigma-Delta-ADC, direct-conversion ADC or flash ADC, ramp-compare ADC, Wilkinson ADC, integrating ADC, delta-encoded ADC, pipeline ADC, time-interleaved ADC, ADC with intermediate FM stage, time-stretch ADC, and others.

While this invention has been described with reference to illustrative exemplary embodiments, this description is not intended to be construed in a limiting sense. Various modifications and combinations of the illustrative exemplary embodiments, as well as other embodiments of the invention, will be apparent to persons skilled in the art upon reference to the description. It is therefore intended that the appended claims encompass any such modifications or embodiments.

What is claimed is:

1. An analog to digital converter (ADC) circuit comprising:
   an input stage to receive an input signal and output a modified input signal;
   an input signal selector for supplying the modified input signal to an ADC for conversion to a digital signal;
   a control unit of the ADC; and
   an operational parameter setting device configured to receive an operational parameter setting signal indicative of an operating parameter for the input stage from the control unit, wherein the operational parameter setting device is configured to set an operating parameter for the input stage based on the operational parameter setting signal.

2. The circuit of claim 1, wherein a timing of setting the operational parameter at the input stage is in phase with a conversion timing of the ADC.

3. The circuit of claim 2, wherein the operational parameter setting signal is derived from a channel number of the ADC input to be converted.

4. The circuit of claim 1, wherein the input stage is configured to operate with the set operating parameter, wherein the operating parameter comprises one or more of offset value, impedance, gain, band width, efficiency, filter time, output dynamic range, slew rate, and settling time.

5. The circuit of claim 1, wherein the input stage is configured to power down or power up upon setting the operating parameter for the input stage.

6. The circuit of claim 1, wherein the operational parameter setting device is configured to receive a control signal indicative of a conversion timing at the ADC.

7. The circuit of claim 6, wherein the operational parameter setting device is configured to power up or power down the input stage upon receiving the signal indicative of the conversion timing at the ADC.

8. The circuit of claim 6, wherein the control unit is configured to transmit the control signal to the operational parameter setting device, and wherein the control signal is related to a sampling phase of the ADC.

9. An analog to digital converter (ADC) circuit comprising:
   an input stage for supplying an input signal to an ADC for conversion to a digital signal;
   a control unit of the ADC; and
   an operational parameter setting device configured to receive an operational parameter setting signal indicative of an operating parameter for the input stage from the control unit, wherein the operational parameter setting device is configured to set an operating parameter for the input stage based on the operational parameter setting signal, wherein the control unit is configured to transmit a channel number to an input signal path selecting device coupled to the input of the ADC for selecting an input channel to the ADC, wherein the control unit is configured to transmit a control signal derived from at least a part of the channel number to the operational parameter setting device.

10. The circuit of claim 1, wherein the operational parameter setting device comprises a multiplexer configured to receive the operational parameter setting signal and select the operating parameter from between a plurality of operating parameters.

11. A method of operating an analog to digital convertor (ADC) circuit, the method comprising:
    from a control unit of a ADC, receiving an operational parameter setting signal at an operational parameter setting device;
    setting an operating parameter based on the operational parameter setting signal; and
    configuring an input stage coupled to an input of the ADC using the operating parameter, wherein the operating parameter comprises one or more of offset value, impedance, gain, band width, efficiency, filter time, output dynamic range, slew rate, settling time, power up, and power down.

12. The method of claim 11, further comprising:
    modifying an input signal at the input stage and outputting the modified input signal to the ADC.

13. The method of claim 11, wherein a timing of configuring the input stage is in phase with a conversion timing of the ADC.

14. The method of claim 11, further comprising deriving the operational parameter setting signal from a channel number of the ADC input to be converted.

15. The method of claim 11, wherein configuring an input stage comprises powering down the input stage or powering up the input stage.

16. The method of claim 11, further comprising, receiving, from the control unit at the operational parameter setting device, a signal indicative of a conversion timing at the ADC.

17. The method of claim 16, further comprising powering up or powering down the input stage upon receiving the signal indicative of the conversion timing at the ADC.

18. The method of claim 11, further comprising:
    from the control unit, transmitting a channel number to an input signal path selecting device coupled to the input of the ADC for selecting an input channel to the ADC; and
    from the control unit, transmitting a control signal derived from at least a part of the channel number to the operational parameter setting device, wherein the control signal indicates the operating parameter to be selected for the input stage coupled to the selected input channel.

19. The method of claim 18, wherein transmitting the channel number and transmitting the control signal comprises transmitting the channel number synchronized to the conversion timing of the ADC.

20. The method of claim 18, wherein transmitting the channel number and transmitting the control signal comprises transmitting the channel number at a first time and transmitting the control signal at a second time.

21. The method of claim 18, further comprising transmitting a sampling phase control signal to the operational parameter setting device from the control unit to the operational parameter setting device, and wherein the sampling phase control signal is related to a sampling phase of the ADC.

22. An analog to digital converter (ADC) circuit comprising:
    a control unit coupled to an ADC;
    an input stage for supplying an input signal to the ADC; and
    an operational parameter setting device coupled to the input stage and the control unit, wherein the control unit is configured to send a signal to the operational parameter setting device through a hardware link, and wherein the operational parameter setting device is configured to provide an operating parameter to the input stage based on the signal, wherein the input stage is configured to operate with the set operating parameter, wherein the operating parameter comprises one or more of offset value, impedance, gain, band width, efficiency, filter time, output dynamic range, slew rate, settling time, power up, and power down.

23. The circuit of claim 22, further comprising:
a first register storing a first operation parameter for the input stage; and
a second register storing a second operation parameter for the input stage, wherein the operational parameter setting device is configured to set between the first operation parameter and the second operation parameter based on the signal.

24. The circuit of claim 22, wherein the control unit is configured to transmit a channel number to an input signal path selecting device coupled to the input of the ADC for selecting an input channel to the ADC, wherein the control unit is configured to transmit a control signal derived from at least a part of the channel number to the operational parameter setting device, and wherein the control signal indicates the operating parameter to be selected for the input stage coupled to the selected input channel.

25. The circuit of claim 22, wherein the control unit configured to schedule analog to digital conversions at the ADC.

26. The circuit of claim 9, and wherein the control signal indicates the operating parameter to be selected for the input stage coupled to the selected input channel.

27. The circuit of claim 26, wherein the control unit is configured to transmit the channel number synchronized to the conversion timing of the ADC.

28. The circuit of claim 26, wherein the control unit is configured to transmit the control signal derived from at least a part of the channel number at a first time, wherein the channel number is configured to be transmitted at a second time.

* * * * *